(12) United States Patent
Bookwalter et al.

(10) Patent No.: US 7,652,475 B2
(45) Date of Patent: Jan. 26, 2010

(54) CARTESIAN CONTINUOUS SAMPLING WITH UNEQUAL GRADIENTS

(75) Inventors: Candice A. Bookwalter, University Heights, OH (US); Mark A. Griswold, Shaker Heights, OH (US); Jeffrey L. Sunshine, Pepper Pike, OH (US); Jeffrey L. Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 12/151,027

(22) Filed: May 2, 2008

(65) Prior Publication Data

US 2008/0278162 A1 Nov. 13, 2008

Related U.S. Application Data

(60) Provisional application No. 60/927,179, filed on May 2, 2007.

(51) Int. Cl.
*G01V 3/00* (2006.01)
(52) U.S. Cl. .................. 324/307; 324/309; 324/318
(58) Field of Classification Search ......... 324/300–322; 600/410–435
See application file for complete search history.

(56) References Cited

U.S. PATENT DOCUMENTS

| | | | | |
|---|---|---|---|---|
| 5,307,808 A | * | 5/1994 | Dumoulin et al. | 600/423 |
| 5,977,770 A | * | 11/1999 | Ehman | 324/318 |
| 6,246,896 B1 | * | 6/2001 | Dumoulin et al. | 600/411 |
| 6,289,233 B1 | * | 9/2001 | Dumoulin et al. | 600/410 |
| 6,320,380 B1 | * | 11/2001 | Wu et al. | 324/309 |
| 6,487,435 B2 | * | 11/2002 | Mistretta et al. | 600/420 |
| 6,583,624 B1 | * | 6/2003 | Muthupillai et al. | 324/309 |
| 6,781,375 B2 | * | 8/2004 | Miyazaki et al. | 324/314 |
| 6,794,867 B1 | * | 9/2004 | Block et al. | 324/307 |
| 7,307,423 B2 | * | 12/2007 | Ehman et al. | 324/318 |
| 7,443,166 B2 | * | 10/2008 | Heid | 324/322 |

* cited by examiner

*Primary Examiner*—Brij B Shrivastav
*Assistant Examiner*—Dixomara Vargas
(74) *Attorney, Agent, or Firm*—Kraguljac & Kalnay, LLC

(57) ABSTRACT

Example methods and apparatus control ratios between a maximum gradient amplitude (MGA) of a readout lobe ($G_{READ}$) in a Cartesian continuous sampling read gradient (CSRG) and an MGA of a dephase lobe ($G_{DEPHASE}$) in the CSRG and an MGA of a rephase lobe ($G_{REPHASE}$) in the CSRG, where the direction of $G_{READ}$ is opposite to the direction of $G_{DEPHASE}$, and $G_{REPHASE}$. One example method includes controlling an MR apparatus to produce a CS gradient where $G_{READ}$ and $G_{DEPHASE}$ correspond to the first ratio and where $G_{READ}$ and $G_{REPHASE}$ correspond to the second ratio. One example method includes controlling the MR apparatus to acquire an MR signal in response to the CS gradient. The MR signal is acquired during the read lobe and during a portion of the dephase lobe and/or the rephase lobe. The method includes selectively altering the ratios based on an SNR ratio associated with the MR signal.

16 Claims, 9 Drawing Sheets

US 7,652,475 B2

CARTESIAN CONTINUOUS SAMPLING WITH UNEQUAL GRADIENTS

CROSS REFERENCE TO RELATED APPLICATIONS

This application claims the benefit of U.S. Provisional Patent 60/927,179, filed May 2, 2007, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic Resonance Imaging (MRI) apparatus rely on differences in induced magnetization in biological tissues as a source of image contrast. The induced magnetization can induce a current in a receiver coil(s). The signal measured in a receiver coil(s) is the integral of the induced magnetization over an imaged volume. The signal measured in a receiver coil(s) can be characterized by, for example, a signal to noise ratio (SNR). A certain SNR may be required to allow faithful reconstruction of an image and/or spectra from a magnetic resonance (MR) signal.

To reconstruct an original three dimensional (3D) distribution of magnetization induced in an object, a spatially varying magnetic field pattern (gradient) is generated in the volume so that voxels at different locations produce a signal having spatially distinguishable (e.g., spatially encoded) information. Phase and frequency can be controlled in individual voxels so that each voxel can be distinguished by the phase and frequency of the signal it produces. However, a sampling method that produces an inadequate SNR may make it infeasible and/or impossible to reconstruct an image from the acquired signal.

Image quality may be characterized by factors including, but not limited to, resolution and SNR. SNR is determined by the amount of measured magnetization relative to, for example, thermal noise in an image. The magnetization available to measure depends on the power and duration of an RF (radio frequency) pulse(s) applied to a sample, on the time interval between excitation pulses, and so on. Traditional approaches to improving SNR include using stronger fields, increasing $T_R$ (repetition time), averaging over shots, and so on. However, some of these parameters are limited by physical factors (e.g., gradient slew rate, field strength).

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

"Traditional sampling" is defined herein as data collection over only the constant portion of the readout lobe of a read gradient. Cartesian continuous sampling (CS) extends the acquisition window to collect additional data compared to traditional sampling acquisitions. Window 100 (FIG. 1) illustrates a traditional acquisition window. Window 110 illustrates an example CS acquisition window. In one example CS acquisition window, data collection occurs over the entire read gradient, including the dephase lobe 140, the readout lobe 150, and the rephase lobe 160 in the CS sequence. While window 110 indicates that data collection occurs over the entire read gradient, one skilled in the art will appreciate that in other examples the CS acquisition window may extend beyond a traditional sampling window without extending over the entire read gradient. Using this type of extended CS acquisition window, example systems and methods improve the speed of CS sequences. Example systems and methods may also improve the SNR and/or resolution without increasing acquisition time.

Figure 1:
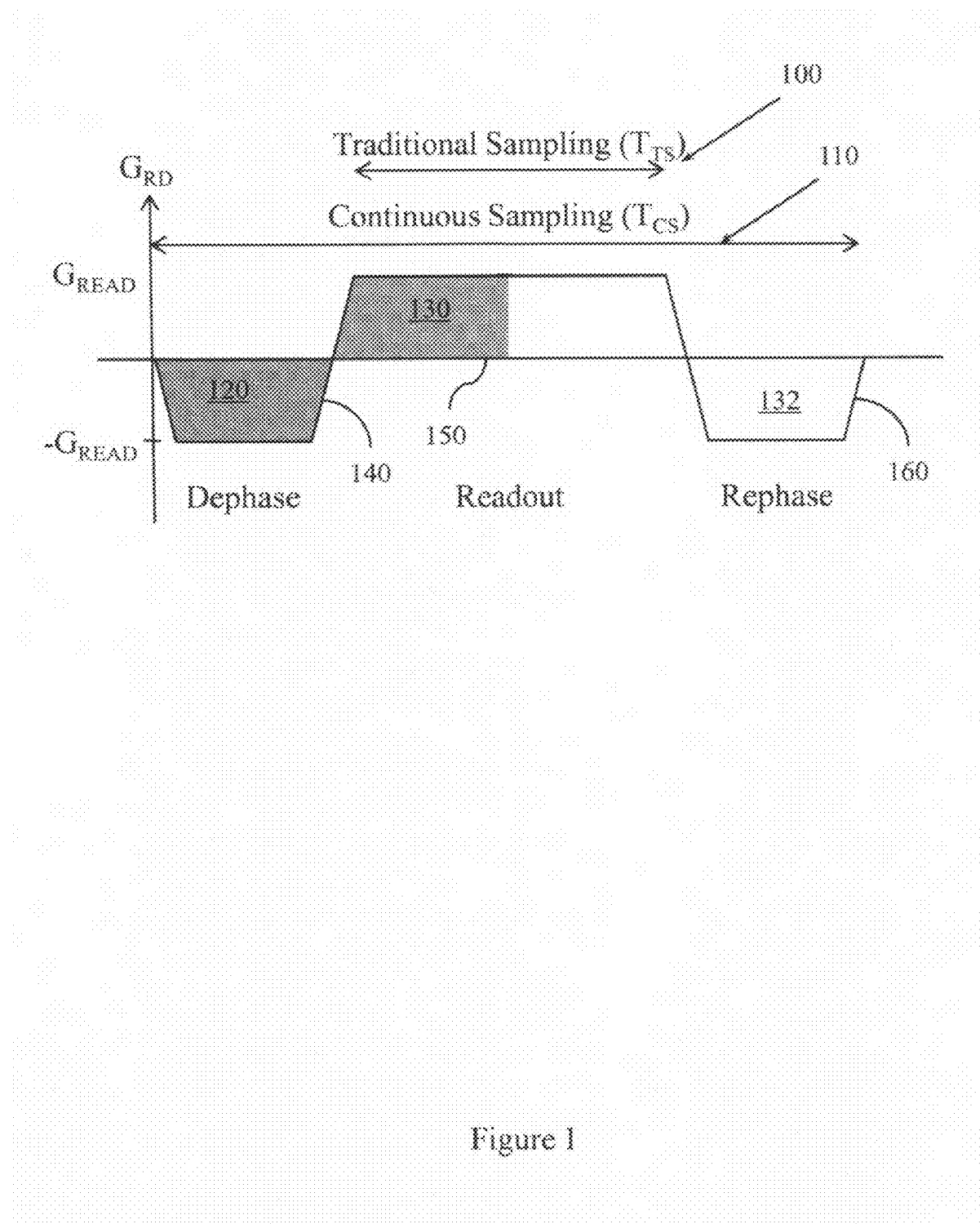
FIG. 1 illustrates lobes of a read gradient in both a traditional Cartesian sampling approach and an example continuous sampling approach.

A conventional, balanced, symmetric CS may sample k-space locations twice when the amplitudes of dephase/rephase lobes in a read gradient are equal and opposite to a readout lobe in the read gradient. "Read gradient" as used herein refers to an entire gradient application including a dephase lobe, a readout lobe, and a rephase or spoiling lobe (if present). FIG. 1 illustrates example conventional lobes used in a read gradient in a typical CS approach. In FIG. 1, the shaded area 120 below the axis and the shaded area 130 above the axis are intended to be equal in area. Area 120 may be referred to herein as a "dephase lobe area." Area 130 may be referred to herein as a "read lobe area". Area 132 may be referred to herein as a "rephase lobe area". Note that the amplitudes of the de-phasing lobe 140, the readout lobe 150, and the re-phasing lobe 160 are equal in magnitude. Note also that the amplitudes of the de-phasing lobe 140 and the readout lobe 150 are opposite, as are the amplitudes of the re-phasing lobe 160 and the readout lobe 150. This isolated, balanced, symmetric CS may sample k-space locations at least twice.

Some imaging methods may employ a shorter TR (repetition time) than can be achieved with the conventional balanced symmetric CS illustrated in FIG. 1. These imaging methods may achieve a shorter TR using shorter dephase/ rephase lobes that are designed to approach constraints associated with maximum gradient slew rates, maximum amplitudes, and so on. Using these types of lobe shapes may make it difficult, if possible at all, to replicate every data point in k-space.

Figure 2:
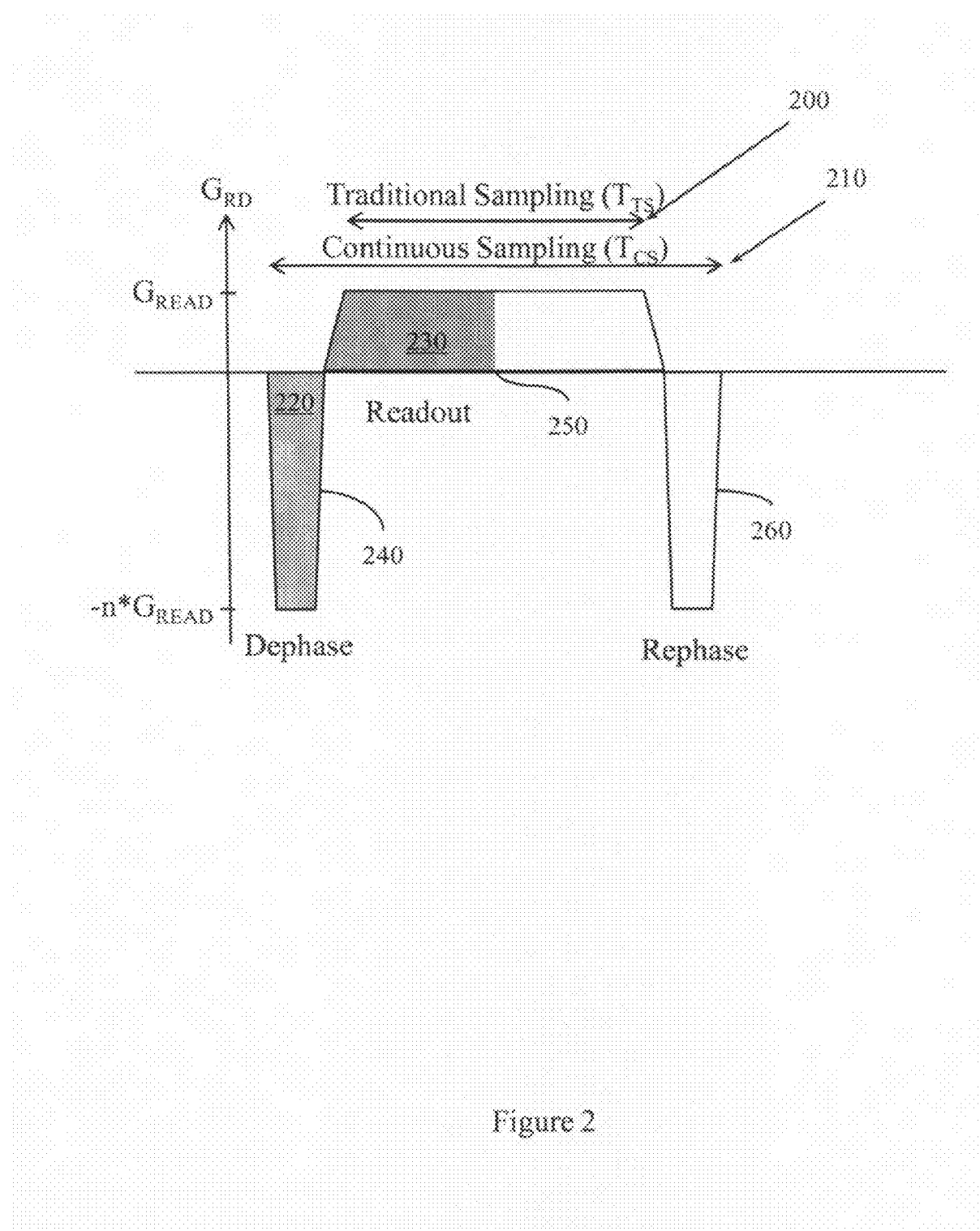
FIG. 2 illustrates lobes of a read gradient in an example continuous sampling approach in which the gradient lobe amplitudes are not equal.

Additionally, some imaging techniques (e.g., asymmetric echoes) may under-sample k-space. Under-sampling may be applied to CS sequences in the form of unequal gradient lobe amplitudes like those illustrated in FIG. 2. FIG. 2 illustrates a traditional sampling window 200 and a CS window 210. In FIG. 2, the amplitudes of the dephase lobe 240 and the rephase lobe 260 are equal to each other, but are not equal to the amplitude of the readout lobe 250. Note also that the amplitudes of the dephase lobe 240 and the rephase lobe 260 are opposite to that of the readout lobe 250. Once again the shaded area 220 beneath the axis (the dephase lobe area) is intended to have the same area as the shaded area 230 above the axis (the readout lobe area). In some spin echo sequences, the dephase and rephase lobes may be of equal polarity yet on opposite sides of an RF pulse while in other approaches (e.g., FLASH, FISP, spin echo without rephase) the dephase and rephase lobes may differ in amplitude and/or duration.

Example systems and methods may use unequal gradient lobe amplitudes like those illustrated in FIG. 2 to improve the time efficiency of CS sequences for rectilinear trajectories, radial trajectories, and so on. These unequal lobe amplitudes may produce shorter, higher amplitude dephase/rephase lobes. The SNR improvement achievable using lobes like those illustrated in FIG. 2 can be characterized using:

$$SNR_{imp} = \frac{\Delta x_{CS} \sqrt{T_{CS}}}{\Delta x_{TS} \sqrt{T_{TS}}} \qquad \text{Equation [1]}$$

where:
$T_{CS}$ is the sampling time for CS;
$T_{TS}$ is the sampling time for traditional sampling;
$\Delta X_{CS}$ is the pixel size for CS; and
$\Delta X_{TS}$ is the pixel size for traditional sampling.

Assuming that the interval between sampled points is constant, the relative amplitudes of the gradients will determine the total number of sampled points. A higher gradient amplitude will lead to relatively fewer points being sampled while a smaller amplitude will lead to relatively more points being sampled. The interval between sampled points may be referred to as the dwell time.

The unequal gradient factor (n) describes a relationship between the maximum gradient amplitude of the readout lobe ($G_{READ}$) and the dephase/rephase lobes ($-n^*G_{READ}$). For $n>1$, fewer points will be collected than if $n=1$. This will reduce $SNR_{IMP}$ as compared to when $n=1$. However, $SNR_{CS}$ will still be better than $SNR_{TS}$. For $n<1$, more points will be collected than if $n=1$. This will improve the SNR and give rise to $SNR_{IMP}$ as compared to when $n=1$.

Figure 3:
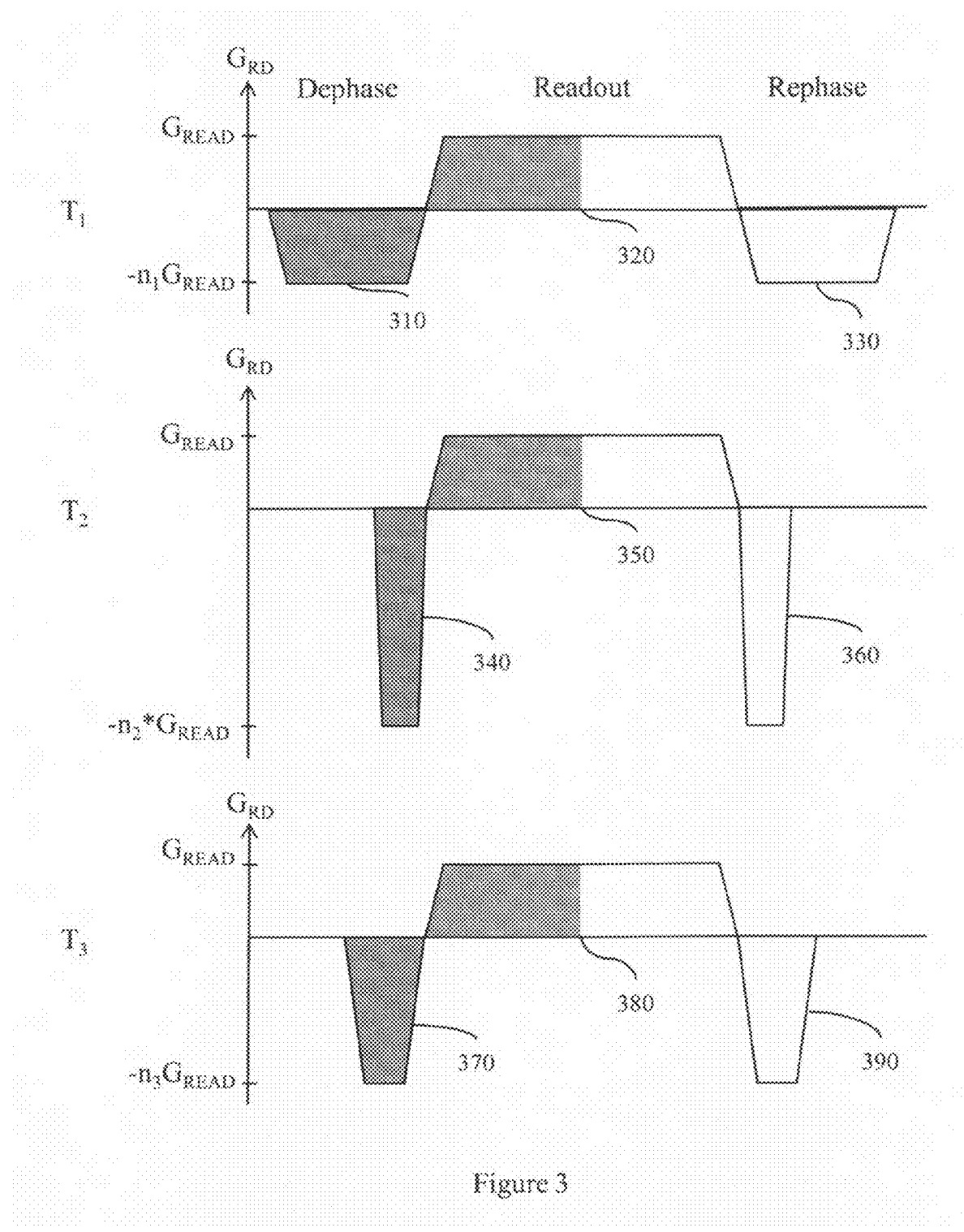
FIG. 3 illustrates dynamically adapted lobes of a read gradient in a series of example sampling approaches.

In one example, n can be tuned dynamically until $SNR_{CS}$ meets and/or exceeds a desired SNR or resolution threshold. FIG. 3 illustrates example lobe shapes that may be created using this dynamic tuning approach. At time $t_1$, a first value for n (e.g., $n_1$) is selected and used to control the shape of the dephase lobe 310 and the rephase lobe 330. The lobes 310 and 330 have amplitudes opposite to that of readout lobe 320. The SNR produced by the lobe shapes associated with $t_1$ may be analyzed. Based on this analysis, at time $t_2$, a second value for n (e.g., $n_2$) may be selected. Once again this value may be used to control the shape of the dephase lobe 340 and rephase lobe 360. The lobes 340 and 360 have amplitudes opposite to that of readout lobe 350. The SNR produced by these lobe shapes may be analyzed. Based on this analysis, at time $t_3$, a third value for n (e.g., $n_3$) may be selected to control the shape of dephase lobe 370 and rephase lobe 390. Once again the amplitude of dephase lobe 370 and rephase lobe 390 are opposite to readout lobe 380. This selection, shape control, and resulting SNR analysis may be repeated until, for example, a desired SNR is achieved. Additionally, and/or alternatively, different values for n may be selected during a pre-scan period and a value for n may be chosen so that a desired SNR may be achieved. While similar values for n are illustrated, it is to be appreciated that the value of n for dephase lobes and rephase lobes can differ.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
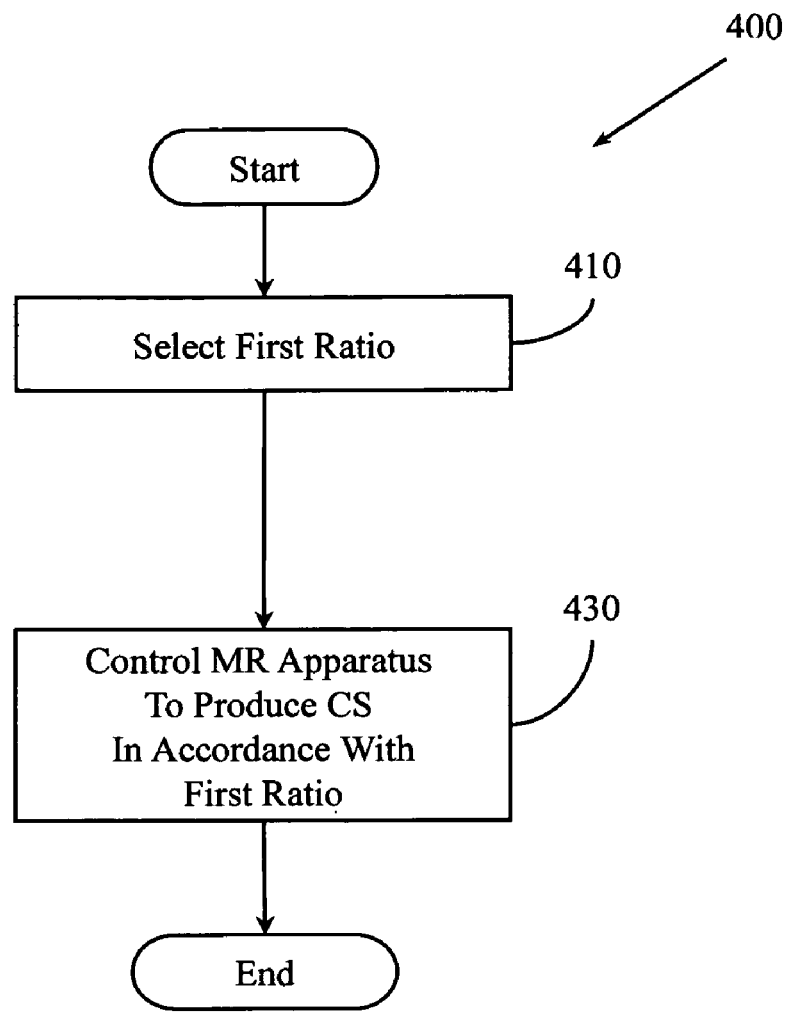
FIG. 4 illustrates a method associated with Cartesian continuous sampling.

FIG. 4 illustrates a method 400 associated with performing Cartesian continuous sampling with unequal gradients. Method 400 may include, at 410, selecting a first ratio between a maximum gradient amplitude of a readout lobe ($G_{READ}$) in a Cartesian continuous sampling (CS) read gradient and a maximum gradient amplitude of a dephase lobe ($G_{DEPHASE}$) in the CS read gradient. As illustrated in FIG. 1, FIG. 2, and FIG. 3, the $G_{READ}$ and $G_{DEPHASE}$ may be in opposite directions. The first ratio may be selected based on prior results, based on a heuristic, based on a user input, and so on. In one example, the first ratio is greater than one. In addition to the amplitude, the ratio will also control the shape of the different lobes in the CS read gradient.

Method 400 also includes, at 430, controlling an MR apparatus to produce a CS gradient where $G_{READ}$ and $G_{DEPHASE}$ correspond to the first ratio. Controlling the MR apparatus may include, for example, writing a value(s) to a register(s), calling a subroutine in a process running on the MR apparatus, providing a value to a method associated with the MR apparatus, applying a voltage to a circuit in the MR apparatus, and so on. In one example, the CS gradient lobes are crafted with constraints. For example, the CS gradient may be crafted so that the area of the dephase lobe equals one half the area of the read lobe and so that the area of the rephase lobe equals one half the area of the read lobe area.

Figure 5:
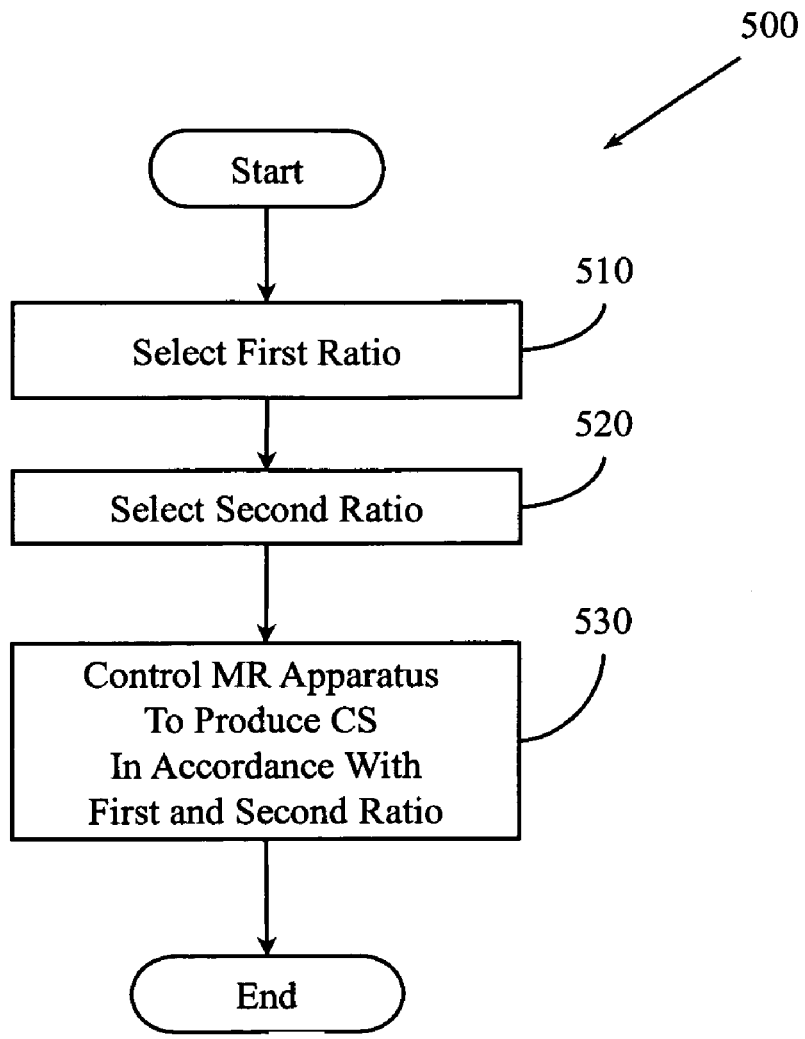
FIG. 5 illustrates a method associated with Cartesian continuous sampling.

FIG. 5 illustrates a method 500 that includes some actions similar to those described in connection with method 400 (FIG. 4). For example, method 500 includes selecting a first ratio at 510 and controlling an MR apparatus to produce a CS gradient at 530. However, method 500 also includes, at 520, selecting a second ratio between $G_{READ}$ in the CS read gradient and a maximum gradient amplitude of a rephase lobe ($G_{REPHASE}$) in the CS read gradient. Once again, $G_{READ}$ and $G_{REPHASE}$ are in opposite directions. With the second ratio available, the controlling at 530 includes controlling the MR apparatus to produce a CS gradient where $G_{READ}$ and $G_{DEPHASE}$ correspond to the first ratio and where $G_{READ}$ and $G_{REPHASE}$ correspond to the second ratio. In one example, the first ratio may not equal the second ratio. In one example, both the first ratio and the second ratio may be greater than one.

Figure 6:
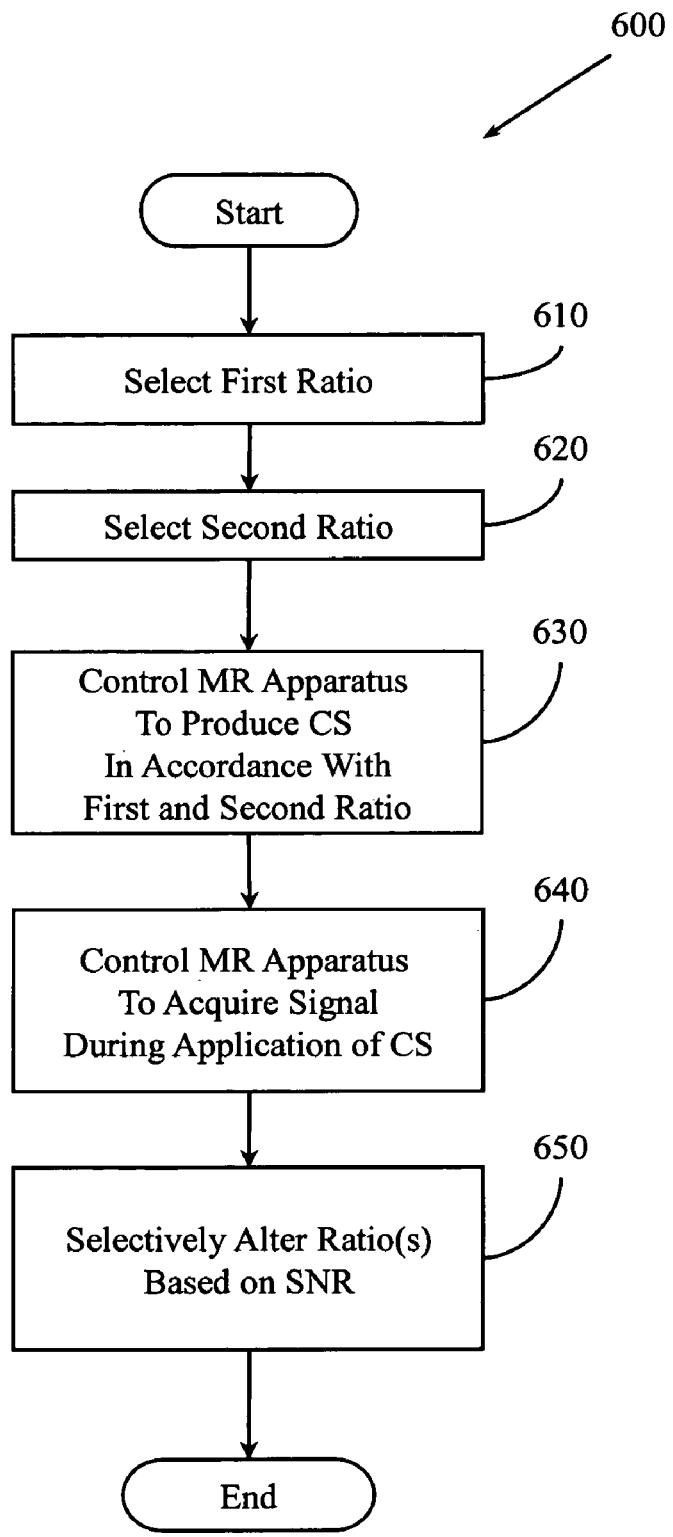
FIG. 6 illustrates a method associated with Cartesian continuous sampling.

FIG. 6 illustrates a method 600 that includes some actions similar to those described in connection with method 500 (FIG. 5). For example, method 600 includes selecting a first ratio at 610, selecting a second ratio at 620, and controlling an MR apparatus to produce a CS gradient at 630. However, method 600 includes additional actions.

For example, method 600 includes, at 640, controlling the MR apparatus to acquire an MR signal in response to the CS gradient. In one example the MR signal is acquired during the read lobe of the CS gradient and during at least a portion of the dephase lobe and/or the rephase lobe. In one example, the MR signal is acquired during the entire read lobe, during the entire dephase lobe, and during the entire rephase lobe. One skilled in the art will appreciate that MR signal may be acquired during different combinations and durations of lobes described above.

With an MR signal acquired in response to the CS gradient, method 600 may proceed, at 650, by selectively altering the first ratio and/or the second ratio. The altering may be based, at least in part, on an SNR ratio associated with the MR signal. For example, if the SNR is less than a desired threshold, then different values for the first and/or second ratio may be selected. After selecting the new values, the MR apparatus may be controlled to produce a different CS gradient and to acquire MR signal during the application of the different CS gradient. The SNR of the new MR signal may be analyzed and the process may repeat until, for example, a desired SNR is achieved.

In one example, method 600 may include picking a set of first ratios at 610 and picking a set of second ratios at 620. In this example, the controlling at 630 may include producing a set of CS gradients and the controlling at 640 may include acquiring a set of MR signals. In this example, the selective altering at 650 may be based on selecting ratios and SNRs from the sets picked and produced earlier.

Figure 7:
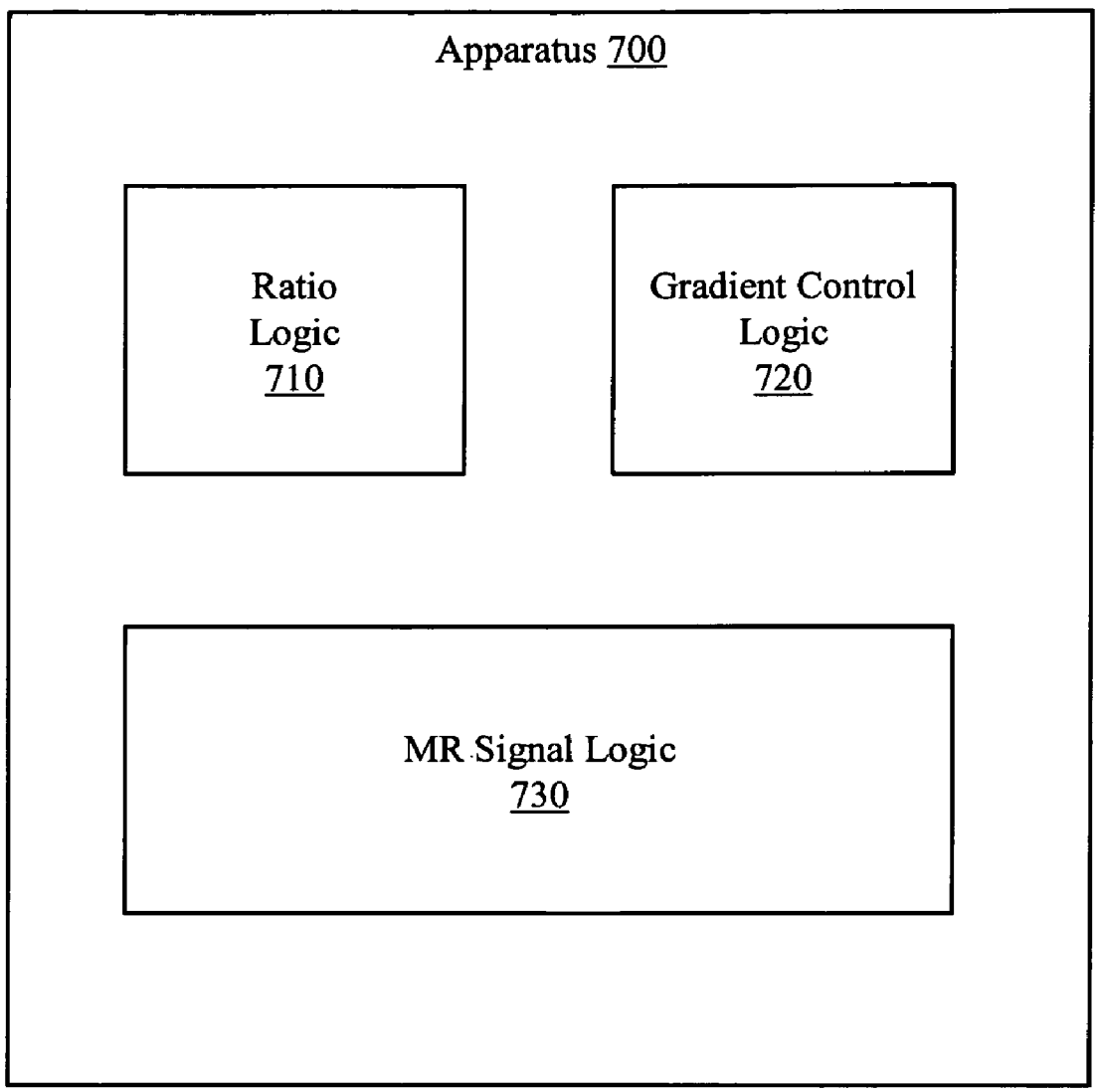
FIG. 7 illustrates an apparatus associated with Cartesian continuous sampling.

FIG. 7 illustrates an apparatus 700 associated with controlling CS gradient shape by manipulating ratios between maximum gradient amplitudes. In one example, apparatus 700 may be incorporated into an MRI apparatus. In another example, apparatus 700 may be external to but operably connected to an MRI apparatus. Apparatus 700 includes a ratio logic 710. Ratio logic 710 is to select a first ratio between $G_{READ}$ in a CS read gradient and $G_{DEPHASE}$ in the CS read gradient. $G_{READ}$ and $G_{DEPHASE}$ are in opposite directions as illustrated in FIG. 1, FIG. 2, and FIG. 3. Apparatus 700 also includes a gradient control logic 720. Gradient control logic 720 is to control an MR apparatus to produce a CS gradient where $G_{READ}$ and $G_{DEPHASE}$ correspond to the first ratio.

In one example, the ratio logic 710 is to select a second ratio between $G_{READ}$ and $G_{REPHASE}$ in the CS read gradient. Once again, $G_{READ}$ and $G_{REPHASE}$ are in opposite directions. In this example, the gradient control logic 720 is to control the MR apparatus to produce a CS gradient where $G_{READ}$ and $G_{DEPHASE}$ correspond to the first ratio and where $G_{READ}$ and $G_{REPHASE}$ correspond to the second ratio. In different examples the first ratio and the second ratio may be greater than one and/or may be unequal. In one example, the shape of the lobes may depend on the ratios. However, in one example, even though the ratios may be unequal, the area of the read lobe may be controlled to equal the area of the dephase lobe plus the area of the rephase lobe.

Apparatus 700 also includes an MR signal logic 730. MR signal logic 730 is to acquire an MR signal during application of the CS gradient. In one example, the MR signal is acquired during the read lobe of the CS gradient and during at least a portion of the dephase lobe and/or the rephase lobe. In another example, the MR signal is acquired during the entire CS gradient. One skilled in the art will appreciate that other signal acquisition schemes may acquire signal during less than the entire CS gradient.

Acquiring the MR signal may provide information upon which a reconfiguration decision can be made. For example, the ratio logic 710 may selectively alter the first ratio and/or the second ratio based, at least in part, on an SNR ratio associated with the MR signal. In one example, apparatus 700 may select a set of first ratios and second ratios, may generate a set of CS gradients based on the sets of ratios, and may acquire a set of signals in response to applying the CS gradients. In this example, the ratio logic 710 may then select a first ratio and second ratio that produced a greatest and/or desired SNR.

Figure 8:
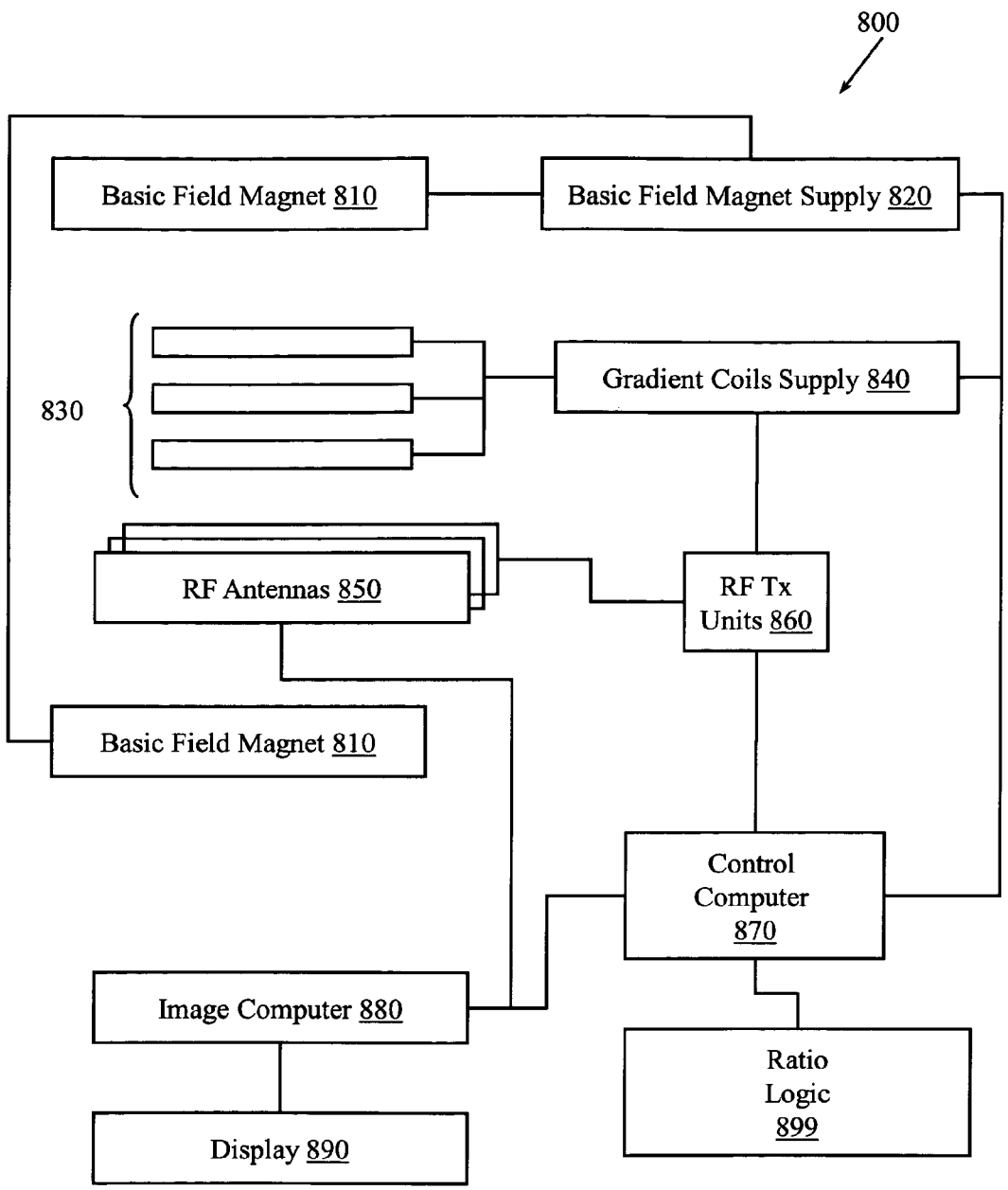
FIG. 8 illustrates an MRI apparatus configured with a read gradient ratio logic.

FIG. 8 illustrates an MRI apparatus 800 configured with a ratio logic 899. Logic 899 facilitates selecting different ratios between $G_{READ}$, $G_{DEPHASE}$, and $G_{REPHASE}$ and thus facilitates controlling CS gradient shape and size. The ratio logic 899 may be configured with elements of example apparatus described herein and/or may perform example methods described herein. In one example, ratio logic 899 may select a set of ratios, acquire performance information (e.g., SNR data) associated with different members of the set of ratios, and decide on a first and second ratio based on the performance information.

The apparatus 800 includes a basic field magnet(s) 810 and a basic field magnet supply 820. Ideally, the basic field magnets 810 would produce a uniform $B_0$ field. However, in practice, the Bo field may not be uniform, and may vary over an object being imaged by the MRI apparatus 800. MRI apparatus 800 includes gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted during an MRI procedure.

MRI apparatus 800 includes a set of RF antennas 850 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an MRI device as described herein. The magnetic resonance signals received from the RF antennas 850 can be employed to generate an image and thus may be subject to a transformation process like a two dimensional fast Fourier Transform that generates pixilated image data. The transformation can be performed by an image computer 880 or other similar processing device. The image data may then be shown on a display 890. While FIG. 8 illustrates an example MRI apparatus 800 that includes various components connected in various ways, it is to be appreciated that other MRI apparatus may include other components connected in other ways.

Figure 9:
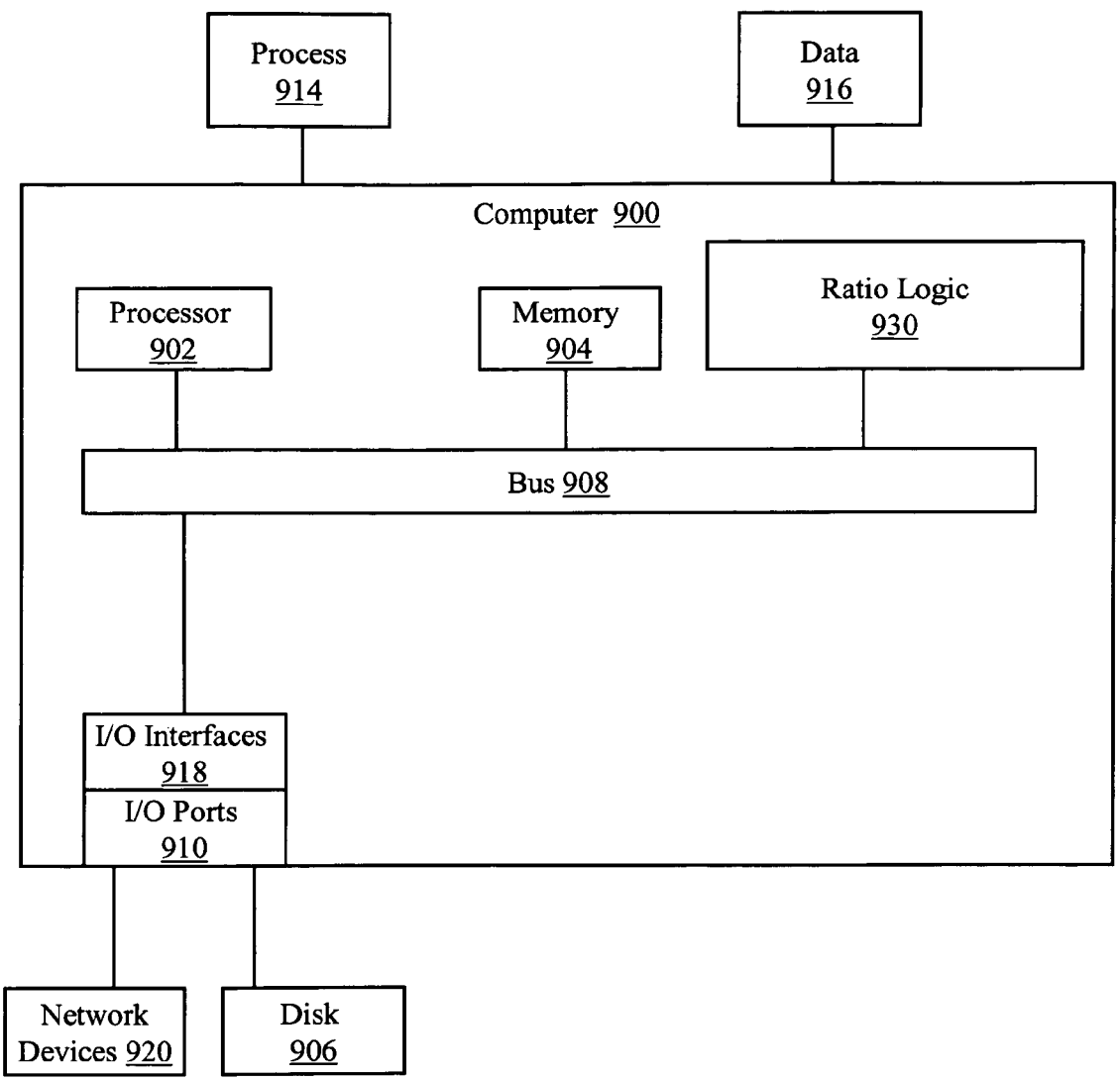
FIG. 9 illustrates an example computing device in which example systems and methods, and equivalents, may operate.

FIG. 9 illustrates an example computing device in which example methods described herein, and equivalents, may operate. The example computing device may be a computer 900 that includes a processor 902, a memory 904, and input/output ports 910 operably connected by a bus 908. In one example, the computer 900 may include a ratio logic 930 to facilitate selecting different ratios between $G_{READ}$, $G_{DEPHASE}$, and $G_{REPHASE}$ and thus facilitate controlling CS gradient shape and size. In different examples, the logic 930 may be implemented in hardware, software, firmware, and/or combinations thereof. While the logic 930 is illustrated as a hardware component attached to the bus 908, it is to be appreciated that in one example, the logic 930 could be implemented in the processor 902.

Thus, logic 930 may provide means (e.g., hardware, software, firmware) for generating a Cartesian continuous sampling read gradient (CCSRG). The CCSRG has a read lobe, a dephase lobe, and a rephase lobe. The amplitude of the read lobe is opposite to the amplitudes of the dephase lobe and rephase lobe. The means may be implemented, for example, as an ASIC programmed to control an MR apparatus. The means may also be implemented as computer executable instructions that are presented to computer 900 as data 916 that are temporarily stored in memory 904 and then executed by processor 902. Logic 930 may also provide means (e.g., hardware, software, firmware) for dynamically controlling a ratio between the amplitude of the read lobe and the dephase lobe and for controlling a ratio between the amplitude of the read lobe and the rephase lobe. In one example, the control is to be exercised based, at least in part, on an SNR associated with an MR signal acquired during an application of the Cartesian continuous sampling read gradient. The MR signal is to be acquired during the read lobe and during at least a portion of the dephase lobe and/or at least a portion of the rephase lobe. In one example, the MR signal may be acquired during the entire dephase lobe, the entire read lobe, and the entire rephase lobe.

Generally describing an example configuration of the computer 900, the processor 902 may be a variety of various processors including dual microprocessor and other multi-processor architectures. A memory 904 may include volatile memory and/or non-volatile memory. Non-volatile memory may include, for example, ROM, PROM, and so on. Volatile memory may include, for example, RAM, SRAM, DRAM, and so on.

A disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a Zip drive, a flash memory card, a memory stick, and so on. Furthermore, the disk 906 may be a CD-ROM drive, a CD-R drive, a CD-RW drive, a DVD ROM, and so on. The memory 904 can store a process 914 and/or a data 916, for example. The disk 906 and/or the memory 904 can store an operating system that controls and allocates resources of the computer 900.

The bus 908 may be a single internal bus interconnect architecture and/or other bus or mesh architectures. While a single bus is illustrated, it is to be appreciated that the computer 900 may communicate with various devices, logics, and peripherals using other busses (e.g., PCIE, 1394, USB, Ethernet). The bus 908 can be types including, for example, a memory bus, a memory controller, a peripheral bus, an external bus, a crossbar switch, and/or a local bus.

The computer 900 may interact with input/output devices via the i/o interfaces 918 and the input/output ports 910. Input/output devices may be, for example, a keyboard, a microphone, a pointing and selection device, cameras, video cards, displays, the disk 906, the network devices 920, and so on. The input/output ports 910 may include, for example, serial ports, parallel ports, and USB ports. The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A computer-readable medium storing computer executable instructions that when executed by a computer cause the computer to perform a method, the method comprising:

selecting a first ratio between a maximum gradient amplitude of a readout lobe ($G_{READ}$) in a Cartesian continuous sampling (CS) read gradient and a maximum gradient amplitude of a dephase lobe ($G_{DEPHASE}$) in the CS read gradient, where $G_{READ}$ and $G_{DEPHASE}$ are in opposite directions;

controlling an MR apparatus to produce a CS read gradient where $G_{READ}$ and $G_{DEPHASE}$ correspond to the first ratio;

selecting a second ratio between $G_{READ}$ in the CS read gradient and a maximum gradient amplitude of a rephase lobe ($G_{REPHASE}$) in the CS read gradient, where $G_{READ}$ and $G_{REPHASE}$ are in opposite directions; and controlling the MR apparatus to produce a CS read gradient where $G_{READ}$ and $G_{DEPHASE}$ correspond to the first ratio and where $G_{READ}$ and $G_{REPHASE}$ correspond to the second ratio; and where the first ratio does not equal the second ratio.

2. The computer-readable medium of claim 1, where the first ratio is greater than one.

3. The computer-readable medium of claim 2, where the second ratio is greater than one.

4. The computer-readable medium of claim 1, where the second ratio is greater than one.

5. The computer-readable medium of claim 1, where the method includes controlling the MR apparatus to acquire an MR signal in response to the CS read gradient, where the MR signal is acquired during the read lobe and during at least a portion of one or more of, the dephase lobe, and the rephase lobe.

6. The computer-readable medium of claim 5, where the method includes selectively altering the first ratio based, at least in part, on a signal to noise (SNR) ratio associated with the MR signal.

7. The computer-readable medium of claim 1, where the method includes controlling the MR apparatus to acquire an MR signal in response to the CS read gradient, where the MR signal is acquired during the read lobe and during at least a portion of one or more of, the dephase lobe, and the rephase lobe.

8. The computer-readable medium of claim 1, where the method includes controlling the MR apparatus to acquire an MR signal in response to the CS read gradient, where the MR signal is acquired during the entire read lobe, during the entire dephase lobe, and during the entire rephase lobe.

9. The computer-readable medium of claim 7, where the method includes selectively altering one or more of, the first ratio, and the second ratio based, at least in part, on an SNR ratio associated with the MR signal.

10. The computer-readable medium of claim 8, where the method includes selectively altering one or more of, the first ratio, and the second ratio based, at least in part, on an SNR ratio associated with the MR signal.

11. The computer-readable medium of claim 1, where the area of the dephase lobe equals one half the area of the read lobe and where the area of the rephase lobe equals one half the area of the read lobe area.

12. An apparatus, comprising:
a ratio logic to select a first ratio between a maximum gradient amplitude of a readout lobe ($G_{READ}$) in a Cartesian continuous sampling (CS) read gradient and a maximum gradient amplitude of a dephase lobe ($G_{DEPHASE}$) in the CS read gradient, where $G_{READ}$ and $G_{DEPHASE}$ are in opposite directions; and
a gradient control logic to control an MR apparatus to produce a CS read gradient where $G_{READ}$ and $G_{DEPHASE}$ correspond to the first ratio;

where the ratio logic is to select a second ratio between $G_{READ}$ in the CS read gradient and a maximum gradient amplitude of a rephase lobe ($G_{REPHASE}$) in the CS read gradient, where $G_{READ}$ and $G_{REPHASE}$ are in opposite directions; and where the gradient control logic is to control the MR apparatus to produce a CS read gradient where $G_{READ}$ and $G_{DEPHASE}$ correspond to the first ratio and where $G_{READ}$ and $G_{REPHASE}$ correspond to the second ratio;

an MR signal logic to acquire an MR signal in response to the CS read gradient, where the MR signal is acquired during the read lobe and during at least a portion of one or more of, the dephase lobe and the rephase lobe; and where the ratio logic is to selectively alter one or more of, the first ratio, and the second ratio based, at least in part, on an SNR ratio associated with the MR signal.

13. The apparatus of claim 12, comprising:
an MR signal logic to acquire an MR signal in response to the CS read gradient, where the MR signal is acquired during the entire read lobe, during the entire dephase lobe, and during the entire the rephase lobe; and
where the ratio logic is to selectively alter one or more of, the first ratio, and the second ratio based, at least in part, on an SNR ratio associated with the MR signal.

14. The apparatus of claim 12, where the first ratio is greater than one, where the second ratio is greater than one, where the first ratio does not equal the second ratio and where the area of the read lobe equals the area of the dephase lobe plus the area of the rephase lobe.

15. The apparatus of claim 12, where the apparatus is incorporated in an MRI apparatus.

16. A system, comprising:
means for generating a Cartesian continuous sampling read gradient having a read lobe, a dephase lobe, and a rephase lobe, where the amplitude of the read lobe is opposite to the amplitudes of the dephase lobe and rephase lobes;
means for dynamically controlling a ratio between the amplitude of the read lobe and the dephase lobe and for controlling a ratio between the amplitude of the read lobe and the rephase lobe, where the control is based, at least in part, on an SNR associated with an MR signal acquired during an application of the Cartesian continuous sampling read gradient, where the MR signal is acquired during the read lobe and during at least a portion of the dephase lobe and at least a portion of the rephase lobe.

* * * * *